(12) United States Patent
Kim

(10) Patent No.: US 9,911,802 B2
(45) Date of Patent: Mar. 6, 2018

(54) DISPLAY DEVICE AND METHOD FOR MANUFACTURING THE SAME

(71) Applicant: SAMSUNG DISPLAY CO., LTD., Yongin-Si, Gyeonggi-Do (KR)

(72) Inventor: Do-Hoon Kim, Asan-si (KR)

(73) Assignee: SAMSUNG DISPLAY CO., LTD., Yongin-si, Gyeonggi-Do (KR)

(\*) Notice: Subject to any disclaimer, the term of this patent is extended or adjusted under 35 U.S.C. 154(b) by 0 days.

(21) Appl. No.: 14/919,079

(22) Filed: Oct. 21, 2015

(65) Prior Publication Data
US 2016/0284783 A1    Sep. 29, 2016

(30) Foreign Application Priority Data
Mar. 27, 2015    (KR) .................... 10-2015-0043388

(51) Int. Cl.
| | |
|---|---|
| *H01L 27/32* | (2006.01) |
| *H01L 27/12* | (2006.01) |
| *H01L 29/66* | (2006.01) |
| *H01L 29/786* | (2006.01) |

(52) U.S. Cl.
CPC ........ *H01L 27/3276* (2013.01); *H01L 27/124* (2013.01); *H01L 27/1248* (2013.01); *H01L 27/1259* (2013.01); *H01L 27/3248* (2013.01); *H01L 27/3297* (2013.01); *H01L 29/66757* (2013.01); *H01L 29/78675* (2013.01); *H01L 2227/323* (2013.01)

(58) Field of Classification Search
CPC .......................... H01L 27/124; H01L 27/3276
See application file for complete search history.

(56) References Cited

U.S. PATENT DOCUMENTS

| | | | |
|---|---|---|---|
| 2008/0169471 A1* | 7/2008 | Shin .................... | G02F 1/13458 257/59 |
| 2011/0266543 A1* | 11/2011 | Moriwaki .......... | G02F 1/13624 257/59 |

FOREIGN PATENT DOCUMENTS

| | | |
|---|---|---|
| KR | 100831267 | 5/2008 |
| KR | 1020080066478 | 7/2008 |
| KR | 1020140095357 | 8/2014 |

\* cited by examiner

*Primary Examiner* — Fernando L Toledo
*Assistant Examiner* — Valerie N Newton
(74) *Attorney, Agent, or Firm* — F. Chau & Associates, LLC

(57) ABSTRACT

A method for manufacturing a display device, according to an exemplary embodiment of the present inventive concept, includes forming a semiconductor of a transistor on a substrate, forming a gate insulating layer on the semiconductor, forming a control electrode and a first pad on the gate insulating layer, forming an interlayer insulating layer on the control electrode and the first pad, forming a first photosensitive film on the interlayer insulating, forming a plurality of first contact holes and a second contact hole by etching the interlayer insulating layer using the first photosensitive film patterns as a mask, removing a first portion of the interlayer insulating layer, forming a metal layer on the interlayer insulating layer, forming a second photosensitive film pattern on the metal layer, forming an input electrode and an output electrode, and removing the second photosensitive film pattern and a second portion of the interlayer insulating layer.

12 Claims, 13 Drawing Sheets

DISPLAY DEVICE AND METHOD FOR MANUFACTURING THE SAME

CROSS-REFERENCE TO RELATED APPLICATION

This application claims priority under 35 U.S.C. § 119 to Korean Patent Application No. 10-2015-0043388, filed on Mar. 27, 2015, in the Korean Intellectual Property Office, the disclosure of which is incorporated by reference herein in its entirety.

TECHNICAL FIELD

The present inventive concept relates to a display device, and more particularly, to a display device including a pad part and a method for manufacturing the same.

DESCRIPTION OF THE RELATED ART

A display device such as an organic light emitting display device may be manufactured by forming devices on a substrate such as glass or plastic. Integrated circuit chips for generating various signals for operating the display device may be mounted on a predetermined region of the substrate. The substrate may be a chip on glass (COG), a chip on flexible printed circuit board, and the like, depending on where an integrated circuit chip is mounted.

In the COG, an integrated circuit chip is mounted on the substrate by interposing an anisotropic conductive film (ACF) between an electrode pad and a terminal of the integrated circuit chip which are formed on the substrate, for example.

A pad part attached to the ACF may be formed together with pixels of the display device. Depending on a pixel structure, an insulating layer positioned on the pad part may be removed when patterning a pad of the pad part. When the insulating layer is removed, a signal line of the pad part may be exposed and may be susceptible to corrosion or a bonding defect.

SUMMARY

According to an exemplary embodiment of the present inventive concept, a method for manufacturing a display device includes forming a semiconductor of a transistor on a substrate, wherein the substrate has a pixel region and a pad region, forming a gate insulating layer on the semiconductor, forming a control electrode on the gate insulating layer of the pixel region and a first pad on the gate insulating layer of the pad region, forming an interlayer insulating layer on the control electrode and the first pad, forming a first photosensitive film pattern having a first portion disposed on a region of the interlayer insulating layer corresponding to the pixel region, and a second portion disposed on a region of the interlayer insulating layer corresponding to the pad region, wherein the second portion of the first photosensitive film pattern is thicker than the first portion of the first photosensitive film pattern, forming a plurality of first contact holes exposing the semiconductor and a second contact hole exposing the first pad, wherein the plurality of first contact holes and the second contact hole are formed by etching the interlayer insulating layer using the first photosensitive film pattern as a mask, removing the first portion the first photosensitive film pattern, forming a metal layer on the interlayer insulating layer, forming a second photosensitive film pattern on the metal layer, forming an input electrode connected to the semiconductor through a first contact hole of the plurality of first contact holes, an output electrode connected to the semiconductor through a second contact hole of the plurality of first contact holes, and a second pad connected to the first pad through the second contact hole, wherein the input electrode, the output electrode, and the second pad are formed by patterning the metal layer using the second photosensitive film pattern as a mask, and removing the second photosensitive film pattern and the second portion of the first photosensitive film pattern.

According to an exemplary embodiment of the present inventive concept, a boundary line of the second photosensitive film pattern corresponding to the second pad overlaps with the second portion of the first photosensitive film pattern.

According to an exemplary embodiment of the present inventive concept, a boundary line of the second pad overlaps with the second portion of the first photosensitive film pattern.

According to an exemplary embodiment of the present inventive concept, a method for manufacturing a display device includes, forming a semiconductor of a transistor on a substrate, wherein the substrate has a pixel region and a pad region, forming a gate insulating layer on the semiconductor, forming a control electrode on the gate insulating layer on the pixel region, forming a first pad on the gate insulating layer on the pad region, forming an interlayer insulating layer on the control electrode and the first pad, forming a first photosensitive film pattern having a first portion and a second portion, wherein the first portion of the first photosensitive film pattern is disposed on a portion of the interlayer insulating layer corresponding to the pixel region, and the second portion of the first photosensitive film pattern is disposed on a portion of the interlayer insulating layer corresponding to the pad region, wherein the second portion of the first photosensitive film pattern is thicker than the first portion of the first photosensitive film pattern, forming a plurality of first contact holes exposing the semiconductor and a second contact hole exposing the first pad, wherein the plurality of first contact holes and the second contact hole are formed by etching the interlayer insulating layer using the first photosensitive film pattern as a mask, removing the first portion of the first photosensitive film pattern, forming a metal layer on the interlayer insulating layer, forming a second photosensitive film pattern on the metal layer, forming an input electrode connected to the semiconductor through a first contact hole of the plurality of first contact holes, an output electrode connected to the semiconductor through a second contact hole of the plurality of first contact holes, and a second pad connected to the first pad through the second contact hole, wherein the input electrode, the output electrode, and the second pad are formed by patterning the metal layer using the second photosensitive film pattern as a mask, and removing the second photosensitive film pattern and the second portion of the first photosensitive film pattern, wherein the first portion of the first photosensitive film pattern is disposed around the second contact hole in the pad region.

According to an exemplary embodiment of the present inventive concept, a first boundary of the second photosensitive film pattern corresponding to the second pad may be formed between the second contact hole and a second boundary of the second portion of the first photosensitive film pattern.

According to an exemplary embodiment of the present inventive concept, a recessed part of the interlayer insulating layer is formed around a boundary of the second pad.

According to an exemplary embodiment of the present inventive concept, the recessed part has a width of 1 µm or less.

According to an exemplary embodiment of the present inventive concept, a display device includes, a substrate having a pixel region and a pad region, a transistor disposed on the pixel region of the substrate, wiring disposed on the pad region of the substrate, wherein the wiring is connected to the transistor and to a first pad, an interlayer insulating layer disposed on the first pad, the interlayer insulating layer has a contact hole exposing the first pad, and a second pad connected to the first pad through the contact hole, wherein the interlayer insulating layer has a recess part having the same planar shape as a second pad, wherein the recess part is disposed along a boundary of the second pad.

According to an exemplary embodiment of the present inventive concept, the recess part has a width of 1 µm or less.

According to an exemplary embodiment of the present inventive concept, the display device further includes a first electrode connected to the transistor, an organic light emitting layer disposed on the first electrode, and a second electrode disposed on the organic light emitting layer.

According to an exemplary embodiment of the present inventive concept, the transistor includes a semiconductor disposed on the substrate, a gate insulating layer is disposed on the semiconductor, a control electrode is disposed on the gate insulating layer, an input electrode is disposed on the control electrode, wherein the input electrode is connected to the semiconductor through a first contact hole, and an output electrode is disposed on the control electrode, wherein the output electrode is connected to the semiconductor through a second contact hole.

According to an exemplary embodiment of the present inventive concept, the first pad is disposed on the same layer as the control electrode, wherein the first pad includes a material that is the same as a material included in the control electrode.

According to an exemplary embodiment of the present inventive concept, the second pad is formed on the same layer as the input and output electrodes, the second pad including a material that is the same as a material included in the input and output electrodes.

According to an exemplary embodiment of the present inventive concept, a display device includes a substrate having a pixel region and a pad region, a transistor disposed on the pixel region of the substrate, wiring disposed on the pad region of the substrate, wherein the wiring is connected to the transistor and to a first pad, an interlayer insulating layer disposed on the first pad, wherein the interlayer insulating layer has a first contact hole exposing the first pad, and a second pad connected to the first pad through the first contact hole, wherein a groove is formed around the second pad on a top portion of the interlayer insulating layer and extends along a border of the second pad, wherein the groove forms a closed loop.

According to an exemplary embodiment of the present inventive concept, the groove has a width of 1 µm or less.

According to an exemplary embodiment of the present inventive concept, the display device of claim 14, further includes a first electrode connected to the transistor, an organic light emitting layer disposed on the first electrode, and a second electrode disposed on the organic light emitting layer.

According to an exemplary embodiment of the present inventive concept, the transistor includes a semiconductor disposed on the substrate, a gate insulating layer is disposed on the semiconductor, a control electrode is disposed on the gate insulating layer, an input electrode is disposed on the control electrode, wherein the input electrode is connected to the semiconductor through a second contact hole, and wherein an output electrode is disposed on the control electrode, wherein the output electrode is connected to the semiconductor through a second contact hole.

According to an exemplary embodiment of the present inventive concept, the first pad is disposed on the same layer as the control electrode, wherein the first pad includes a material that is the same as a material included in the control electrode.

According to an exemplary embodiment of the present inventive concept, the second pad is formed on the same layer as the input and output electrodes, wherein the second pad includes a material that is the same as a material included in the input and output electrodes.

DETAILED DESCRIPTION OF THE EMBODIMENTS

Figure 1:
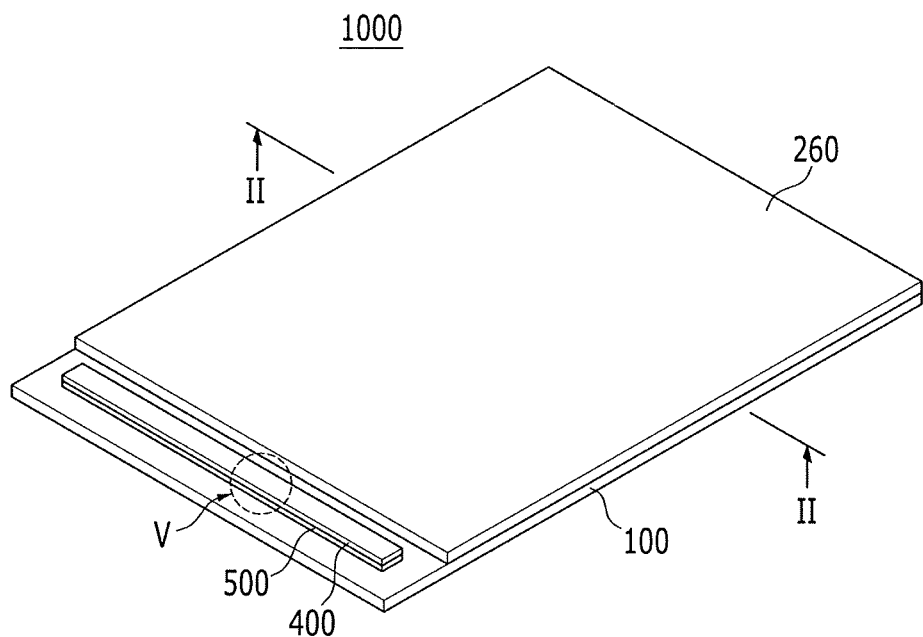
FIG. 1 is a perspective view showing a display device according to an exemplary embodiment of the present inventive concept.

Hereinafter, exemplary embodiments of the present inventive concept will be described in detail with reference to the accompanying drawings. The present inventive concept may be implemented in various different forms and is not limited to the exemplary embodiments described herein.

Like reference numerals may designate like elements throughout the specification.

In the drawings, the thicknesses of layers, films, panels, regions, and the like, may be exaggerated for clarity. It will be understood that when an element such as a layer, film, region, or substrate is referred to as being "on" another element, it may be directly on the other element or intervening elements may be present.

Exemplary embodiments of the present inventive concept relate to an organic light emitting display device including an organic light emitting layer. However, the present inventive concept is not limited thereto. For example, the present inventive concept may be applied to a display device such as a liquid crystal display, a plasma display panel, a field emission display, or the like.

An organic light emitting display device of an active matrix (AM) type of a 2Tr-1Cap structure having two thin film transistors (TFT) and one capacitor in a pixel is shown in the accompanying drawings. However, the present inventive concept is not limited thereto. In an organic light emitting display device according to an exemplary embodiment of the present inventive concept, the number of transistors, the number of capacitors, and the number of wires are not limited and may be greater or less than those shown. A pixel may refer to a component that displays a unit of an image, and an organic light emitting display panel displays an image using a plurality of pixels.

A display device according to an exemplary embodiment of the present inventive concept will be described with reference to the accompanying drawings.

Figure 2:
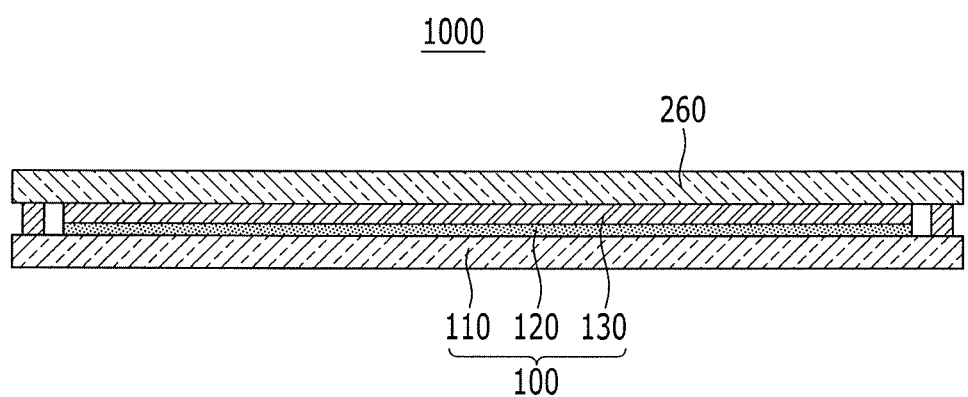
FIG. 2 is a cross-sectional view taken along line II-II of FIG. 1, according to an exemplary embodiment of the present inventive concept.

FIG. 1 is a perspective view showing a display device according to an exemplary embodiment of the present inventive concept. FIG. 2 is a cross-sectional view taken along line II-II of FIG. 1.

As shown in FIGS. 1 and 2, a display device 1000 may include a display panel 100, an encapsulation member 260, and an integrated circuit chip 400 connected to a pad part 500.

The display panel 100 may include a substrate 110, a wiring part 120, and a light emitting part 130 including an organic light emitting element.

The substrate 110 may include plastics or glass such as polycarbonate, polyimide, polyether sulfone, or the like. The substrate 110 may be a transparent, flexible, and elastic. The substrate 110 may be foldable, bendable, rollable, or stretchable in at least one direction, or the like. However, according to an exemplary embodiment of the present inventive concept, the substrate 110 may include a metallic member, the metallic member including stainless steel, or the like.

Figure 3:
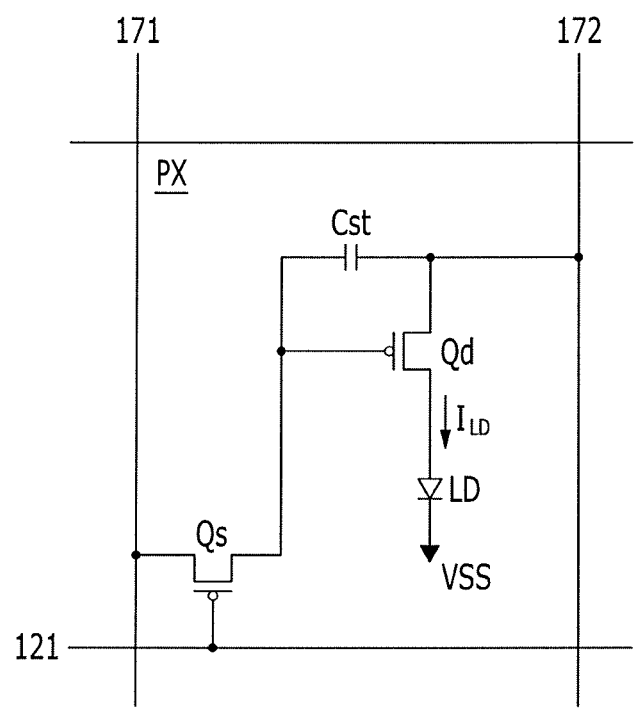
FIG. 3 is an equivalent circuit diagram of a pixel of a display device according to an exemplary embodiment of the present inventive concept.

The wiring part 120 may include a switching transistor Qs and a driving transistor Qd which are illustrated in FIG. 3 and described below. The wiring part 120 may drive an organic light emitting element LD of the light emitting part 130.

The encapsulation member 260 may cover the wiring part 120 and the organic light emitting element LD which are formed on the substrate 110. The encapsulation member 260 may encapsulate and protect the wiring part 120 and the organic light emitting element LD. The encapsulation member 260 may be an encapsulation substrate including glass. The encapsulation member 260 may include a thin film formed by stacking an organic layer or an inorganic layer to increase flexibility.

A portion of the substrate 110 of the display panel 100 may be exposed (e.g., without being encapsulated by the encapsulation member 260) to accommodate a driving circuit. The integrated circuit chip 400 may be positioned (e.g., disposed) on the exposed portion of the substrate 110 of the display panel 100. The integrated circuit chip 400 may be electrically connected to the pad part 500 of the display panel 100 by an anisotropic conductive film (ACF) to transfer a driving signal to the wiring part 120 of the display panel 100 and to drive the organic light emitting element LD.

An internal structure of the display device 1000 will be described in detail by describing a pixel of the display device according to an exemplary embodiment of the present inventive concept, with reference to FIGS. 3 and 4.

Figure 4:
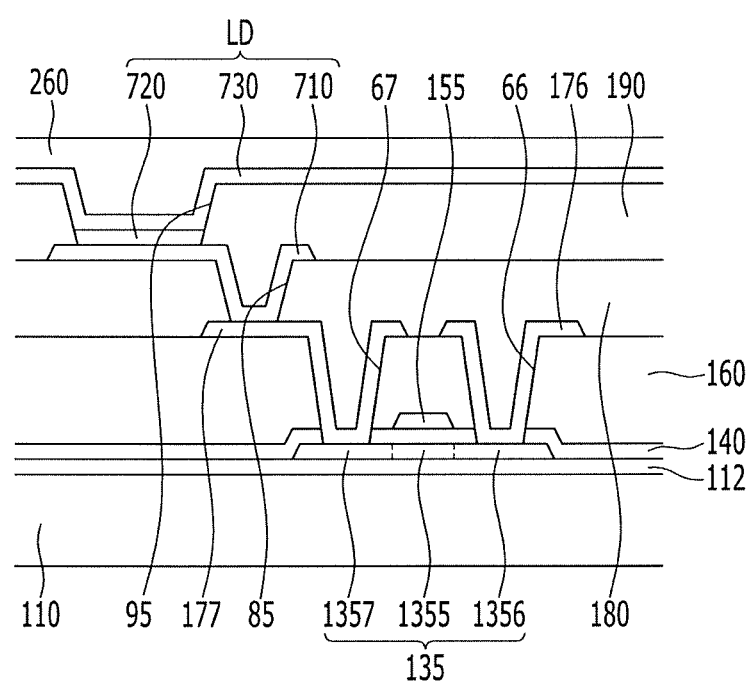
FIG. 4 is a schematic cross-sectional view of a pixel of an organic light emitting display device of FIG. 3, according to an exemplary embodiment of the present inventive concept.

Detailed structures of the organic light emitting element LD and the wiring part 120 are shown in FIGS. 3 and 4. However, the present inventive concept is not limited to the structures shown in FIGS. 3 and 4. For example, the organic light emitting element LD and the wiring part 120 may be formed in various structures.

FIG. 3 is an equivalent circuit diagram of a pixel of a display device according to an exemplary embodiment of the present inventive concept.

The display device 1000, according to an exemplary embodiment of the present inventive concept, may include a plurality of signal lines 121, 171, and 172, and a pixel PX connected to the plurality of signal lines 121, 171, and 172.

The plurality of signal lines 121, 171, and 172 may include scanning signal lines 121 for transferring gate signals (e.g., scan signals), data lines 171 for transferring data signals, driving voltage lines 172 for transferring driving voltages, and the like. The scanning signal lines 121 may extend in a row direction and may be substantially parallel to each other. The data lines 171 may extend in a column direction and may be substantially parallel to each other. In FIG. 3, the driving voltage lines 172 are shown to extend substantially in the column direction. However, the driving voltage lines 172 may extend in the row direction, or in the column direction. In addition, the driving voltage lines 172 may be formed in a mesh shape.

A pixel PX may include a switching transistor Qs, a driving transistor Qd, a storage capacitor Cst, and an organic light emitting element LD.

The switching transistor Qs may include a control terminal, an input terminal, and an output terminal. The control terminal may be connected to the scanning signal line 121, the input terminal may be connected to the data line 171, and the output terminal may be connected to the driving transistor Qd. The switching transistor Qs may transfer data signal received from the data line 171 to the driving transistor Qd in response to a scan signal received from the scanning signal line 121.

The driving transistor Qd may include a control terminal, an input terminal, and an output terminal. The control terminal of the driving transistor Qd may be connected to the switching transistor Qs, the input terminal of the driving transistor Qd may be connected to the driving voltage line 172, and the output terminal of the driving transistor Qd may be connected to the organic light emitting element LD. The driving transistor Qd may allow an output current $I_{LD}$ to flow. A magnitude of the output current $I_{LD}$ may vary depending on a voltage between the control terminal and the output terminal of the driving transistor Qd.

The storage capacitor Cst may be connected between the control terminal and the input terminal of the driving transistor Qd. The storage capacitor Cst may be charged by the data signal applied to the control terminal of the driving transistor Qd and may maintain the data signal after the switching transistor is turned off.

The organic light emitting element LD may be an organic light emitting diode (OLED). The OLED may have an anode connected to the output terminal of the driving transistor Qd and a cathode connected to a common voltage Vss. The organic light emitting element LD may display an image by emitting light having a different intensity depending on the output current $I_{LD}$ of the driving transistor Qd. The organic light emitting element LD may emit a primary color, from among three primary colors such as red, green, and blue. The organic light emitting element LD may include an organic material for emitting light of one color, or light of various colors. The organic light emitting display device may display a desired image by a spatial sum of the colors emitted from a plurality of organic light emitting elements LD.

The switching transistor Qs and the driving transistor Qd may be n-channel field effect transistors (FETs). However, at least one of the switching transistor Qs and at least one of the driving transistors Qd may be a p-channel FET. In addition, a connection relationship of the transistors Qs and Qd, the storage capacitor Cst, and the organic light emitting element LD may be changed.

FIG. 4 is a schematic cross-sectional view of a pixel PX of an organic light emitting display device of FIG. 3.

Since the switching transistor Qs and the driving transistor Qd may have the same interlayer configuration, the following description will focus on the driving transistor Qd and the organic light emitting element LD. Hereinafter, the driving transistor Qd may just be referred to as a transistor.

As shown in FIG. 4, the organic light emitting display device 1000 may include a substrate 110 and a buffer layer 112 formed on the substrate 110.

The buffer layer 112 may be formed as a single layer of silicon nitride (SiNx) or as a double layer in which silicon nitride (SiNx) and silicon oxide (SiOx) may be stacked. For example, the silicon nitride may be SiN or $Si_3N_4$, and the silicon oxide may be $SiO_2$. The buffer layer 112 may flatten a surface while preventing permeation of an unnecessary component such as impurity or moisture.

A semiconductor 135 made of polycrystalline silicon may be formed on the buffer layer 112.

The semiconductor 135 may include a channel region 1355, a source region 1356 and a drain region 1357. The source region 1356 and the drain region 1357 may be formed on sides of the channel region 1355. The channel region 1355 of the semiconductor 135 may include polycrystalline silicon in which an impurity is not doped. For example, the channel region 1355 may include an intrinsic semiconductor. The source region 1356 and the drain region 1357 may include polycrystalline silicon in which a conductive impurity is doped. For example, the source region 1356 and the drain region 1357 may include an impurity semiconductor. The impurity doped in the source region 1356 and the drain region 1357 may be a p-type impurity or n-type impurity.

A gate insulating layer 140 may be formed on the semiconductor 135. The gate insulating layer 140 may include a single layer or multiple layers including at least one of tetra ethyl ortho silicate (TEOS), silicon nitride, and silicon oxide.

A scanning signal line 121 including a control electrode 155 may be formed on the semiconductor 135. The control electrode 155 is overlaid with the channel region 1355. For example, the control electrode 155 may overlap the channel region 1355.

The scanning signal line 121 including the control electrode 155 may include a single layer or a plurality of layers of a low resistance material or a material which may be resistant to corrosion such as aluminum (Al), titanium (Ti), molybdenum (Mo), copper (Cu), nickel (Ni), or an alloy thereof.

A first interlayer insulating layer 160 may be formed on the control electrode 155. The first interlayer insulating layer 160 may include a single layer or a plurality of layers including tetra ethyl ortho silicate (TEOS), silicon nitride, or silicon oxide. The first interlayer insulating layer 160 may include an element similar to an element included in the gate insulating layer 140.

The first interlayer insulating layer 160 and the gate insulating layer 140 may have a source contact hole 66 and a drain contact hole 67 which expose the source region 1356 and the drain region 1357, respectively.

A driving voltage line 172 having an input electrode 176 and an output electrode 177 may be formed on the first interlayer insulating layer 160. The input electrode 176 may be connected to the source region 1356 through the contact hole 66, and the output electrode 177 may be connected to the drain region 1357 through the contact hole 67.

The input electrode 176 and the output electrode 177 may include a single layer or a plurality of layers having a low resistance material or a material which is resistant to corrosion such as aluminum (Al), titanium (Ti), molybdenum (Mo), copper (Cu), nickel (Ni), or an alloy thereof. For example, the input electrode 176 and the output electrode 177 may have a triple layer structure including titanium (Ti), copper (Cu), and titanium (Ti), a triple layer structure including titanium (Ti), silver (Ag), and titanium (Ti), or a triple layer structure including molybdenum (Mo), aluminum (Al), and molybdenum (Mo).

The control electrode 155, the input electrode 176, and the output electrode 177 may form the transistor together with the semiconductor 135. A channel of the transistor may be formed in the semiconductor 135 between the input electrode 176 and the output electrode 177.

A passivation layer 180 may be formed on the input electrode 176 and the output electrode 177. The passivation layer 180 may include a contact hole 85 exposing the output electrode 177.

The passivation layer 180 may include a single layer or a plurality of layers including tetra ethyl ortho silicate (TEOS), silicon nitride, or silicon oxide. The passivation layer 180 may include an element similar to an element included in the first interlayer insulating layer 160, and may include a low dielectric organic material.

A first electrode 710 may be formed on the passivation layer 180. The first electrode 710 may be electrically connected to the output electrode 177 through the contact hole 85. The first electrode 710 may be an anode electrode of the organic light emitting element LD illustrated in FIG. 3.

Although the first interlayer insulating layer 160 may be disposed between the first electrode 710 and the output electrode 177, in an exemplary embodiment of the present inventive concept, the first electrode 710 may be formed on the same layer as the output electrode 177 and may be integrated with the output electrode 177.

A pixel defined layer 190 having an opening part 95 exposing the first electrode 710 may be formed on the first electrode 710.

The pixel defined layer 190 may include a resin such as polyacrylates or polyimides, an inorganic material such as silica, or the like.

The organic light emitting layer 720 may be formed in the opening part 95 of the pixel defined layer 190.

The organic light emitting layer 720 may include a plurality of layers including one or more of a light emitting layer, a hole-injection layer (HIL), a hole-transporting layer (HTL), an electron-transporting layer (ETL), and an electron-injection layer (EIL).

When the organic light emitting layer 720 includes all of the above-mentioned layers, the HIL may be disposed on the first electrode 710 which may be an anode electrode. The HTL, the light emitting layer, the ETL, and the EIL may be sequentially staked on the first electrode 710.

A second electrode 730 may be formed on the pixel defined layer 190 and the organic light emitting layer 720.

The second electrode 730 may be a cathode electrode of the organic light emitting element LD. Therefore, the first electrode 710, the organic light emitting layer 720, and the second electrode 730 may form the organic light emitting element LD.

Depending on a direction in which the organic light emitting element LD emits light, the organic light emitting display device 1000 may have a front display type structure, a rear display type structure, or a double-sided display type structure.

In the case of the front display type structure, the first electrode 710 may be a reflective layer, and the second electrode 730 may be a transflective layer or a permeable layer. In the case of the rear display type structure, the first electrode 710 may be a transflective layer, and the second electrode 730 may be a reflective layer. In the case of the double-sided display type, the first electrode 710 and the second electrode 730 may be a transparent layer or a transflective layer.

The reflective layer and the transflective layer may include one or more metals such as magnesium (Mg), silver (Ag), gold (Au), calcium (Ca), lithium (Li), chromium (Cr), and aluminum (Al), or an alloy thereof. The reflective layer and the transflective layer may have a thickness of 200 nm or less. As the thickness of the reflective layer and the transflective layer decreases, transmittance of light increases. However, when thickness of the reflective layer and the transflective layer decreases, electrical resistance increases.

The transparent layer may include a material such as indium tin oxide (ITO), indium zinc oxide (IZO), zinc oxide (ZnO), indium oxide ($In_2O_3$), or the like.

The encapsulation member 260 may include one or more organic layers and one or more inorganic layers and may be formed by alternately stacking the organic layers and the inorganic layers.

The organic layer of the encapsulation member 260 may include a polymer and may be a single layer. The organic layer of the encapsulation member 260 may include a plurality of stacked layers including polyethylene terephthalate, polyimide, polycarbonate, epoxy, polyethylene, or polyacrylate. For example, the organic layer of the encapsulation member 260 may include polyacrylate, and the polyacrylate may be formed by polymerizing a monomer composition including a deacrylate monomer and a triacrylate monomer. In addition, the monomer composition may further include a monoacrylate monomer. The monomer composition may further include a known photoinitiator such as TPO, but is not limited thereto.

The inorganic layer of the encapsulation member 260 may be a single layer. Alternately, the inorganic layer of the encapsulation member 260 may include stacked layers including a metal oxide or a metal nitride. The inorganic layer may include any one of silicon nitride (SiNx), aluminum oxide ($Al_2O_3$), silicon oxide ($SiO_2$), and titanium dioxide ($TiO_2$).

An uppermost layer of the encapsulation member 260, exposed to the outside, may include an inorganic layer to prevent moisture from permeating into the organic light emitting element LD.

A halogen metal layer including lithium fluoride (LiF) may be additionally included between the second electrode 730 and the encapsulation member 260. The halogen metal layer may protect a lower layer from damage when forming a first inorganic layer by a sputtering method or a plasma deposition method.

The organic layer may have an area smaller than the area of the inorganic layer. The inorganic layer may cover an end portion of the organic layer.

The pad part of the display device according to an exemplary embodiment of the present inventive concept will be described in detail with reference to the accompanying drawings.

Figure 5:
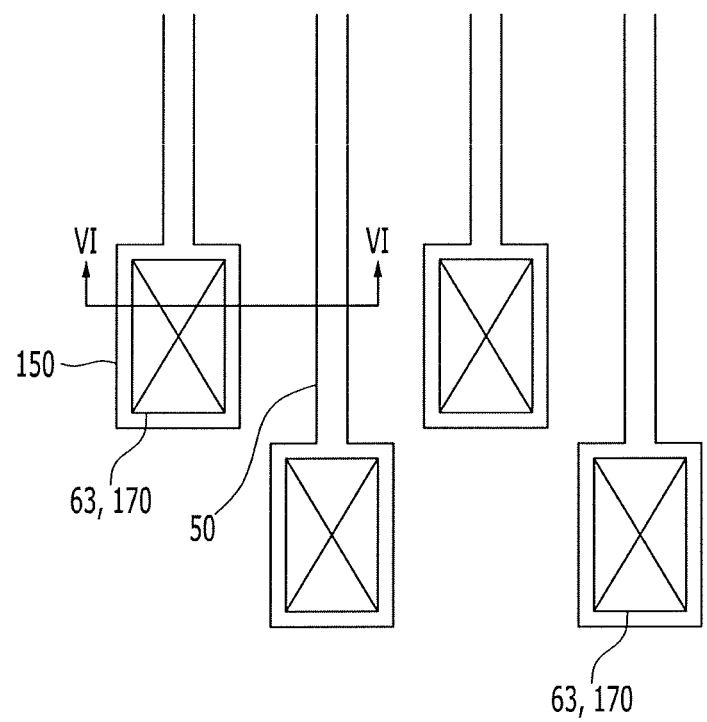
FIG. 5 is an enlarged plan view of a portion V of FIG. 1, according to an exemplary embodiment of the present inventive concept.
Figure 6:
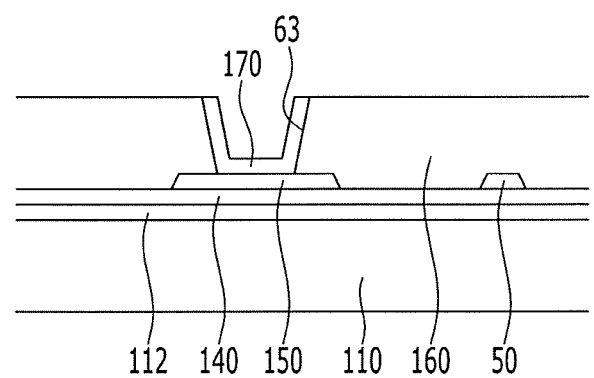
FIG. 6 is a cross-sectional view taken along line VI-VI of FIG. 5, according to an exemplary embodiment of the present inventive concept.

FIG. 5 is an enlarged plan view of the pad part 500 of a portion V of FIG. 1. FIG. 6 is a cross-sectional view taken along line VI-VI of FIG. 5.

As shown in FIGS. 5 and 6, according to an exemplary embodiment of the present inventive concept, a buffer layer 112 and a gate insulating layer 140 are formed on a substrate 110. A first pad 150 may be formed on the gate insulating layer 140. An interlayer insulating layer 160 having a contact hole 63 exposing the first pad 150 may be formed on the first pad 150. A second pad 170 connected to the first pad 150 through the contact hole 63 may be formed on the interlayer insulating layer 160.

The pad part 500 may be positioned in (e.g., disposed on) a gate driving part for applying a scan signal. Thus, the pad part 500 may be a gate pad part, but is not limited thereto. For example, the pad part 500 may be a pad part positioned in the data driving part for applying the data signal.

The first pad 150 may be formed on the same layer and of the same material as the scanning signal line 121 of the pixel PX shown in FIGS. 3 and 4. In this case, the first pad 150 may be connected to a signal line of the pixel PX through the wiring 50. For example, the first pad 150 may be connected to the scanning signal line 121.

The interlayer insulating layer 160 having the contact hole 63 exposing the first pad 150 may be formed on the first pad 150.

The second pad 170, connected to the first pad 150, may be formed on the interlayer insulating layer 160. The second pad 170 may be formed on the same layer and of the same material as the data line 171 of the pixel PX shown in FIGS. 3 and 4.

The second pad 170 may be positioned to correspond to the integrated circuit chip 400 of FIG. 1 and may be connected to the integrated circuit chip 400 by using an ACF. For example, the second pad 170 may be covered by the integrated circuit chip 400 when the integrated circuit chip 400 is disposed on the substrate 110 and be connected to the second pad 170.

The integrated circuit chip 400 may be connected to the substrate 110 by a chip on glass (COG) scheme by bonding a bump of the chip 400 and the second pad 170 to each other.

In the COG scheme, the integrated circuit chip 400 may be directly mounted on the substrate 110. The integrated circuit chip 400 may be bonded to the substrate 110 of the display device 1000 using a bump and an ACF without using a film used in a tape automated bonding (TAP) scheme.

Hereinafter, the method for manufacturing the display device according to an exemplary embodiment of the present inventive concept will be described in detail with reference to the accompanying drawings.

FIGS. 7 to 10 are cross-sectional views illustrating steps of a method for manufacturing a display device according to an exemplary embodiment of the present inventive concept.

For ease in description, FIGS. 7 to 10 show both the pixel PX and the pad part 500 shown in FIGS. 4 and 6.

Figure 7:
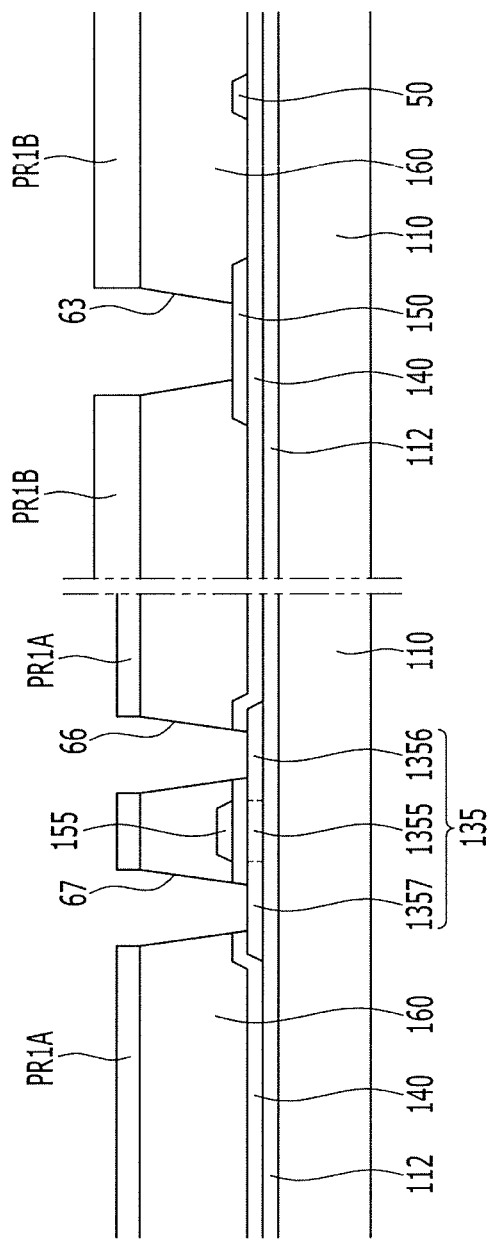
FIGS. 7, 8, 9 and 10 are cross-sectional views illustrating steps of a method for manufacturing a display device according to an exemplary embodiment of the present inventive concept.

As shown in FIG. 7, the buffer layer 112 is formed on the substrate 110. A polycrystalline silicon layer may be formed on a buffer layer 112 and may be then patterned to form a semiconductor 135.

A gate insulating layer 140 may be formed on the semiconductor 135. A metal layer 70 may be formed on the gate insulating layer 140. The metal layer 70 may be patterned to form the wiring 50 having a control electrode 155 and a first pad 150.

A channel region 1355, a source region 1336, and a drain region 1357 may be formed in the semiconductor 135 by doping conductive impurities using the control electrode 155 as a mask. In this case, the semiconductor 135 may be a semiconductor of a driving transistor Qd.

An interlayer insulating layer 160 may be formed on the control electrode 155 and first photosensitive film pattern PR1A and PR1B having different thicknesses may be formed on the interlayer insulating layer 160. The first photosensitive film pattern PR1A and PR1B may have a first portion PR1A having a first thickness and a second portion PR1B having a second thickness. The thickness of the second portion PR1B may be greater than the thickness of the first portion PR1A. The first and second portions PR1A and PR1B of the first photosensitive film pattern PR1A and PR1B may be formed with different thicknesses using a slit exposure, a half-tone mask, or the like.

Contact holes 66, 67, and 63 exposing the source region 1356, the drain region 1357, and the first pad 150 may each be formed by etching the interlayer insulating layer 160 using the first photosensitive film pattern PR1A and PR1B as a mask.

Figure 8:
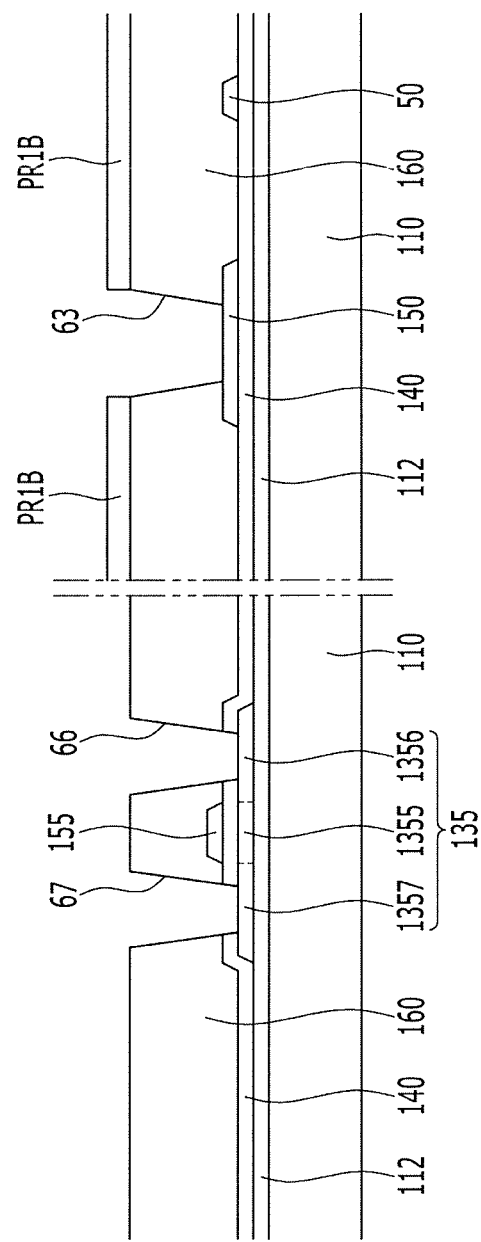

As shown in FIG. 8, the first portion PR1A of the first photosensitive film pattern PR1A and PR1B is removed. In this case, the second portion PR1B may be partially removed (e.g., the thickness of the second portion PR1B may be reduced) when the first portion PR1A is removed.

Figure 9:
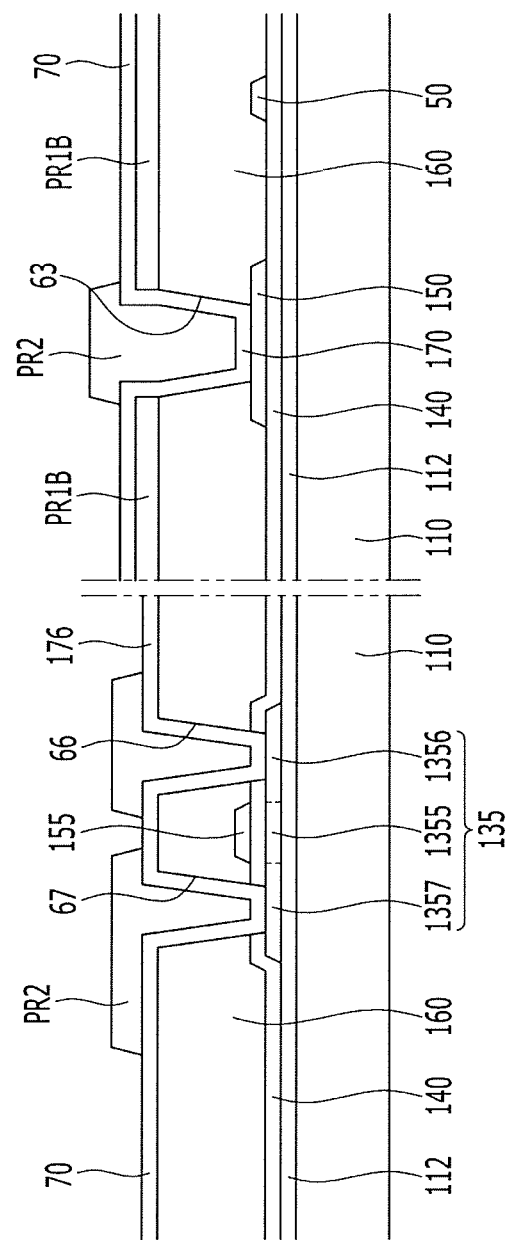

As shown in FIG. 9, a metal layer 70 may be formed on the substrate 110 and a second photosensitive film pattern PR2 may be formed on the metal layer 70.

Figure 10:
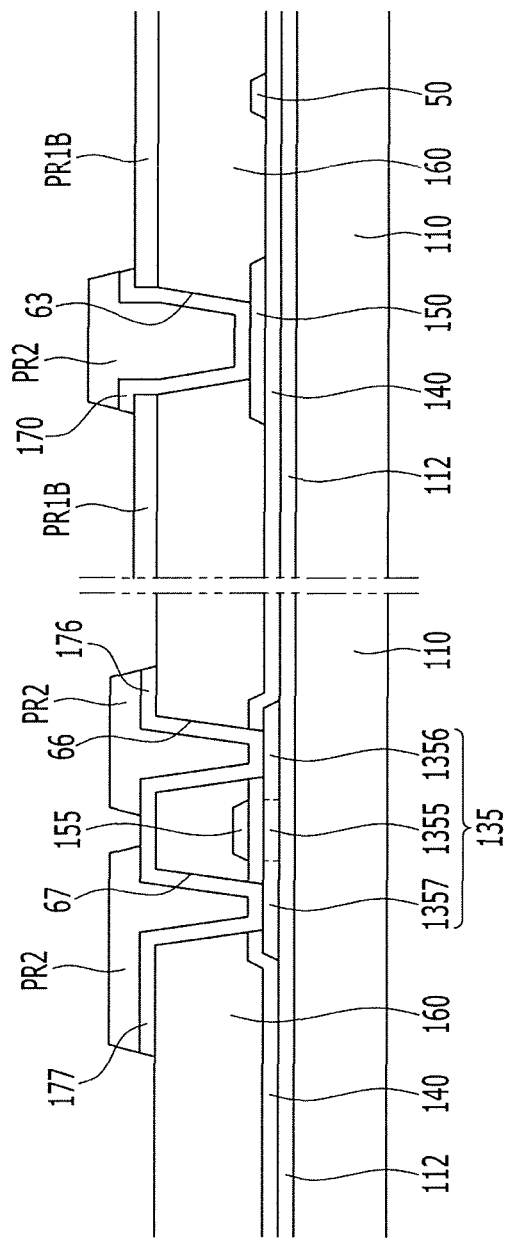

As shown in FIG. 10, an input electrode 176, an output electrode 177, and a second pad 170 may be formed by etching the metal layer 70 using the second photosensitive film pattern PR2 as a mask.

In this case, the second portion PR1B of the first photosensitive film pattern PR1A and PR1B may remain around the second pad 170 to protect the lower interlayer insulating layer 160. Therefore, when the second pad 170 is formed by etching the metal layer 70, the second portion PR1B may protect the interlayer insulating layer 160 disposed at a lower portion of the second pad 170 and around the second pad 170 from being exposed and etched together with the metal layer 70.

When the interlayer insulating layer 160 is exposed and etched without being protected by the first photosensitive film pattern PR1A and PR1B (e.g., when the first photosensitive film pattern PR1A and PR1B is not used), a gap may be generated between the second pad 170 and the interlayer insulating layer 160. Accordingly, a crack may occur in the interlayer insulating layer 160 due to pressure exerted on it during bonding by using an ACF. However, when the interlayer insulating layer 160 is protected by the first photosensitive film pattern PR1A and PR1B as illustrated in FIG. 7, a crack, or the like, and a bonding defect may be prevented from occurring by having the second portion PR1B of the first photosensitive film pattern PR1A and PR1B protect the interlayer insulating layer 160 from damage.

When the interlayer insulating layer 160 is exposed and etched, the first pad 150 disposed below the interlayer insulating layer 160 may be exposed to the outside. When the first pad 150 is exposed to the outside, the first pad 150 may be corroded and damaged. However, according to an exemplary embodiment of the present inventive concept, damage to the interlayer insulating layer 160 may be prevented using the first photosensitive film pattern PR1A and PR1B. Therefore, the first pad 150 may be prevented from being exposed to the outside and damaged.

As shown in FIGS. 4 and 6, the second portion PR1B of the first photosensitive film pattern PR1A and PR1B is removed. In this case, the metal layer 70 positioned on the second portion PR1B may also be removed together with the second portion PR1B by a lift off. In other words, they may be lifted from the substrate 110. Thus, the second pad 170 may be disposed in the contact hole 63.

As shown in FIG. 4, a passivation layer 180 having a contact hole 85 may also be formed on the first interlayer insulation layer 160. A first electrode 710 may be connected to an output electrode 177 through the contact hole 85 of the passivation layer 180. A pixel defined layer 190 having an opening part 95 exposing the first electrode 710 may be formed on the first electrode 710.

An organic light emitting layer 720 may be formed in the opening part 95. A second electrode 730 and the encapsulation member 260 may be formed on the organic light emitting layer 720.

Figure 11:
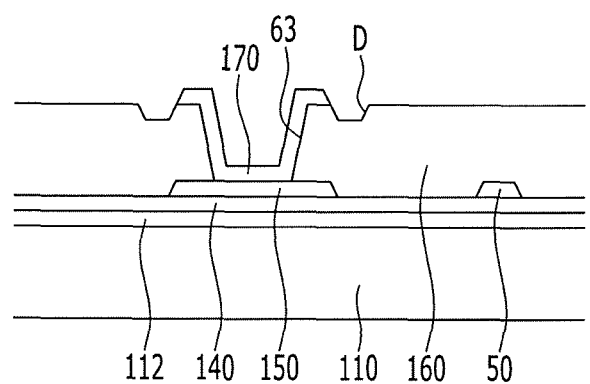
FIG. 11 is a cross-sectional view of a pad part of a display device according to an exemplary embodiment of the present inventive concept.

FIG. 11 is a cross-sectional view of a pad part of a display device according to an exemplary embodiment of the present inventive concept.

Since the display device illustrated in FIG. 11 is similar to the display device illustrated in FIG. 6, only different parts will be described in detail. Like configurations are allocated with like reference numerals.

Referring to FIG. 11, a buffer layer 112 and a gate insulating layer 140 are formed on a pad part 500 of the substrate 110 according to an exemplary embodiment of the present inventive concept. A first pad 150 may be formed on the gate insulating layer 140. An interlayer insulating layer 160 having a contact hole 63 exposing the first pad 150 may be formed on the first pad 150. A second pad 170 connected to the first pad 150 through the contact hole 63 may be formed on the interlayer insulating layer 160.

The interlayer insulating layer 160 may have a recessed part D, wherein the recessed part D may be connected to an end of the second pad 170 and may be formed in the same shape as the second pad 170 along a boundary of the second pad 170. For example, the recessed part D may extend around a boundary of the second pad 170.

A method for manufacturing the pad part shown in FIG. 11 according to an exemplary embodiment of the present inventive concept will be described with reference to the accompanying drawings.

FIGS. 12 to 15 are cross-sectional views illustrating steps of a method for manufacturing a pad part of a display device according to an exemplary embodiment of the present inventive concept. For purposes of clarity, the pixel PX of FIG. 4 is shown together with the pad part 500.

Figure 12:
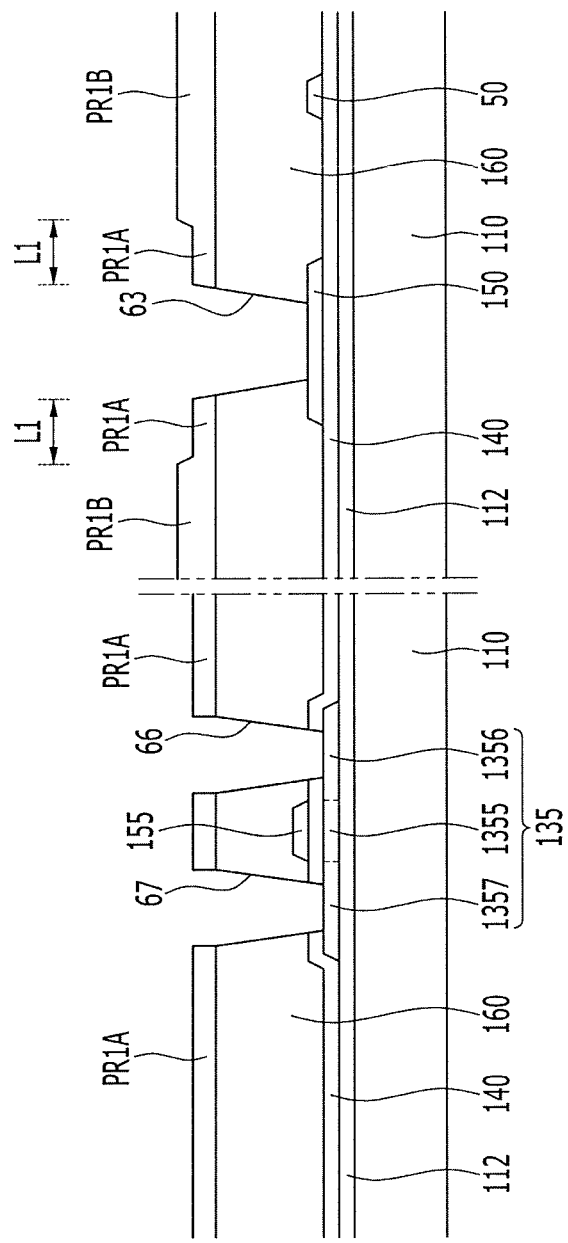
FIGS. 12, 13, 14 and 15 are cross-sectional views illustrating steps of a method for manufacturing a pad part of a display device according to an exemplary embodiment of the present inventive concept.

As shown in FIG. 12, the buffer layer 112 may be formed on the substrate 110. A polycrystalline silicon layer may be formed on the buffer layer 112. The polycrystalline silicon layer may be patterned to form the semiconductor 135.

A gate insulating layer 140 may be formed on the semiconductor 135. A metal layer may be formed on the gate insulating layer 140. The metal layer 70 may be patterned to form the wiring 50 having a control electrode 155 a the first pad 150.

The channel region 1355, the source region 1336, and the drain region 1357 may be formed in the semiconductor 135 by doping conductive impurities using a control electrode 155 as a mask.

The interlayer insulating layer 160 may be formed on the control electrode 155. A first photosensitive film pattern PR1A and PR1B having different thicknesses may be formed on the interlayer insulating layer 160. The first photosensitive film pattern PR1A and PR1B may have a first portion PR1A having a first thickness and a second portion PR1B having a second thickness. The thickness of the second portion PR1B may be greater than the thickness of the first portion PR1A. In this case, the first portion PR1A may be formed around a region L1 and around the contact hole 63 exposing the first pad 150.

Contact holes 66, 67, and 63 exposing the source region, the drain region, and the first pad 150 may each be formed by etching the first photosensitive film pattern PR1A and PR1B using a mask.

Figure 13:
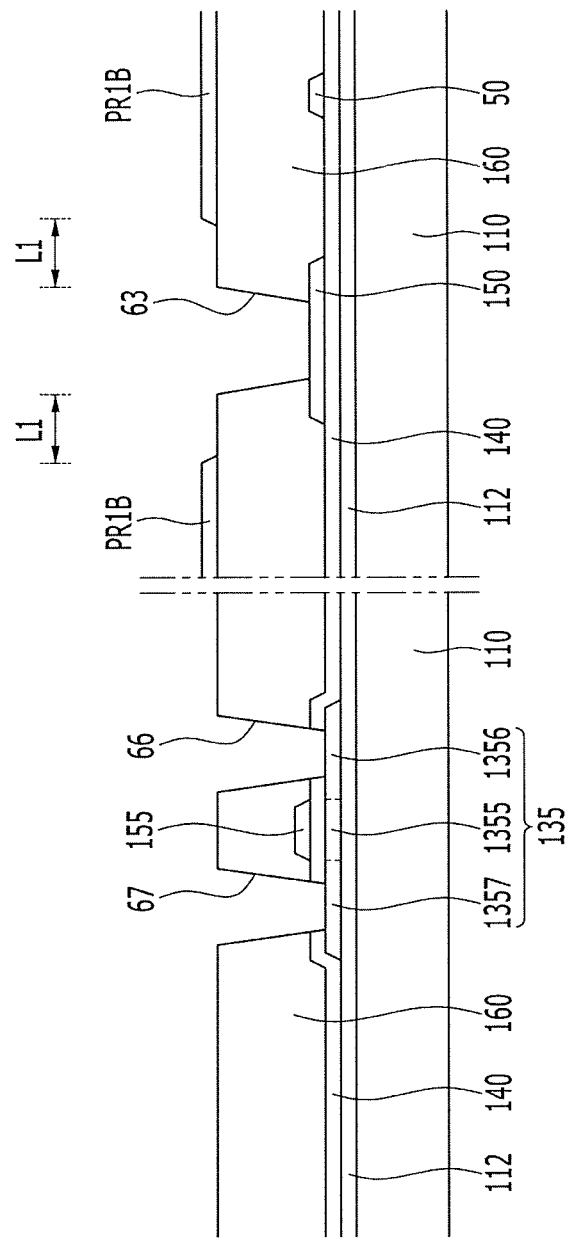

As shown in FIG. 13, the first portion PR1A of the first photosensitive film pattern PR1A and PR1B may be removed. The second portion PR1B may be partially removed when the first portion PR1A is removed. Thus, the thickness of the second portion PR1B may be decreased. The first portion PR1A of the first photosensitive film pattern PR1A and PR1B formed around the L1 region of the contact hole 63 may be removed to expose a lower interlayer insulating layer 160.

Figure 14:
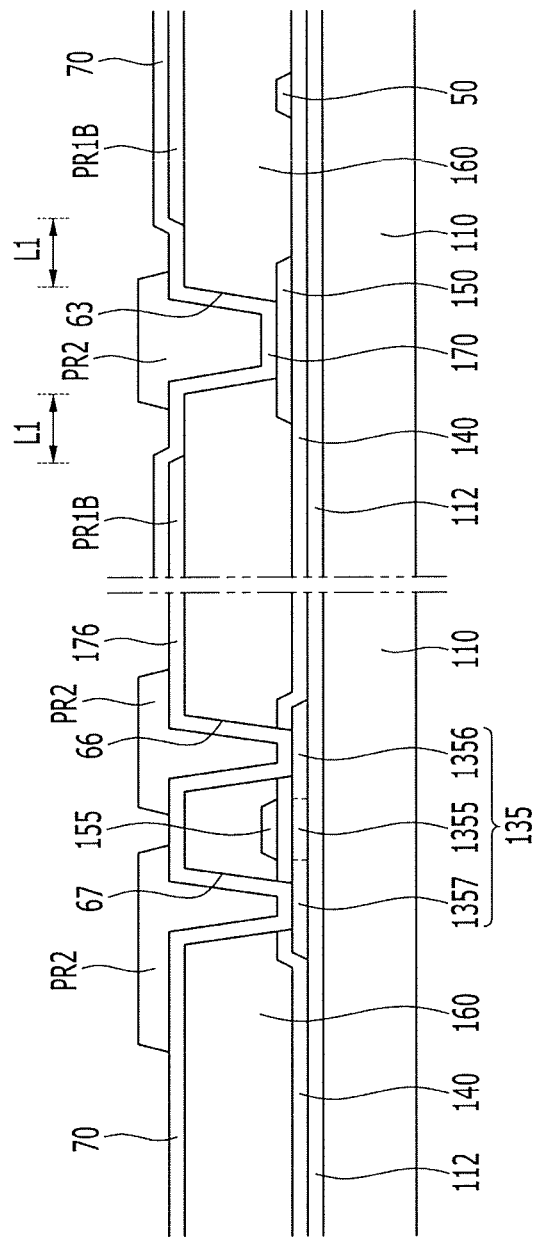

As shown in FIG. 14, a metal layer 70 may be formed on the substrate 110 and a second photosensitive film pattern PR2 may be formed on the metal layer 70.

In this case, a boundary line of the second photosensitive film pattern PR2 positioned on the pad part 500 may be formed on a region L1 around the contact hole 63. The region L1 around the contact hole 63 may correspond to a portion of the exposed interlayer insulating layer 160 between the boundary line of the contact hole 63 and the second portion PR1B.

Figure 15:
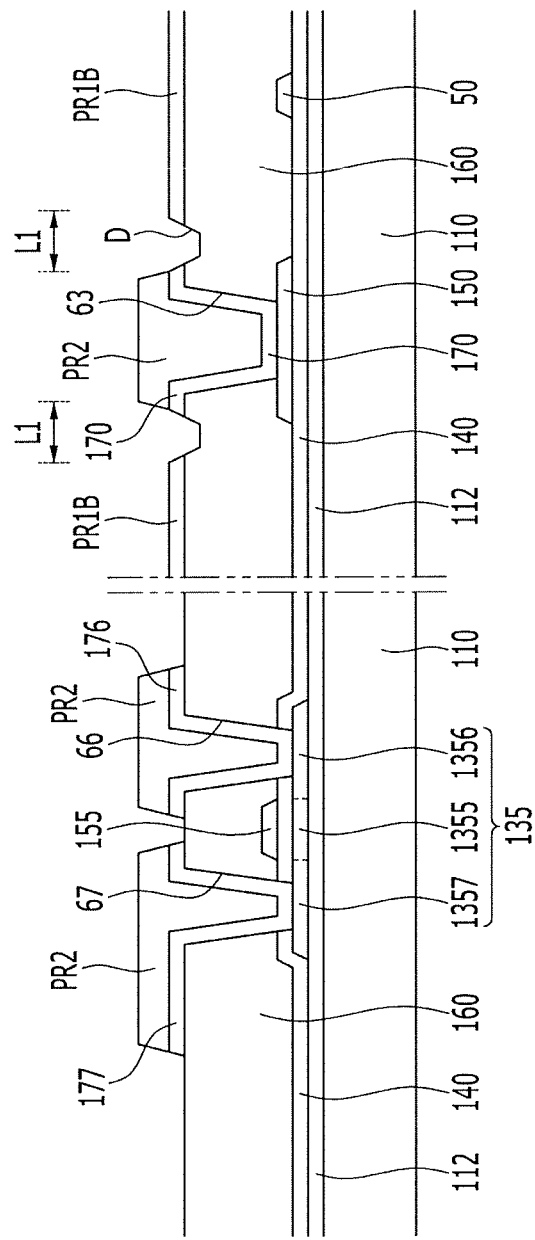

As shown in FIG. 15, an input electrode 176, an output electrode 177, and a second pad 170 may be formed by etching the metal layer 70 using the second photosensitive film pattern PR2 as a mask.

In this case, the second portion PR1B of the first photosensitive film pattern PR1A and PR1B may remain on the second pad 170 to protect the lower interlayer insulating layer 160 from being etched when the metal layer 70 is etched around the second pad 170.

The second photosensitive film pattern PR2 and the second portion PR1B of the first photosensitive film pattern PR1A and PR1B which are disposed on the pad part 500 may be spaced apart from each other.

The boundary line of the second photosensitive film pattern PR2 is positioned on the L1 region around the contact hole 63 of the pad part 500. The metal layer 70, disposed away from the boundary line of the second photosensitive film pattern PR2 (e.g., on the second portion PR1B and on the region L1), may be exposed and etched. Therefore, the interlayer insulating layer 160 disposed below the metal layer 70 in a region away from the border of the second photosensitive film pattern PR2 (e.g., in a gap between the second photosensitive film pattern PR2 and the second portion PR1B) may be exposed and a portion of the exposed interlayer insulating layer 160 may be etched when the metal layer 70 is removed. Thus, a recessed part D may be formed. For example, according to an exemplary embodiment of the present inventive concept, the interlayer insulating layer 160 has a recessed part D having the same shape as a shape of the second pad 170, the recessed part D extending around a boundary of the second pad 170.

In some cases, a gap may be formed between the second photosensitive film pattern PR2 and the second portion PR1B in the pad part 500, but the gap may occur within a process error range. A width of the first portion PR1A of the first photosensitive film pattern PR1A and PR1B around the L1 region of the contact hole 63 may be larger than the error range. However, since a size of the recessed part D may vary depending on a size of the gap, the first portion PR1A may be formed with a width to minimize the gap and thus minimize the size of the recessed part D.

As such, the interlayer insulating layer 160 may be exposed around the second pad 170, such that the recessed part D may be formed, but the width of the recessed part D may be 1 μm or less. As such, in a case in which the width of the recessed part D is small, since the recessed part D is formed to have a depth of a range of about 500 Å to 1000 Å, a portion of the lower insulating interlayer layer 160 that may be damaged is minimized Therefore, even in the case in which the recessed part D is formed, since the size of the recessed part D is small, bonding defects or the like might not occur.

In addition, since the thickness of the interlayer insulating layer 160 removed to form the recessed part D may be small, the interlayer insulating layer 160 may be protected by the first photosensitive film pattern PR1A and PR1B. Therefore, since the interlayer insulating layer 160 is not damaged, the first pad 150 may be prevented from being exposed to the outside and being damaged.

Referring to FIGS. 4 and 11, the second portion PR1B of the first photosensitive film pattern PR1A and PR1B and the second photosensitive film pattern PR2 are removed.

A passivation layer 180 having a contact hole 85 may be formed on the interlayer insulating layer 160. The first electrode 710 connected to the output electrode 177 through the contact hole 85 may be formed on the passivation layer 180. The pixel defined layer 190 having an opening part 95 exposing the first electrode 710 may be formed on the first electrode 710.

An organic light emitting layer 720 may be formed in the opening part 95. A second electrode 730 and an encapsulation member 260 may be formed on the organic light emitting layer 720.

According to an exemplary embodiment of the present inventive concept, a manufacturing method may result in a pad part having a reduced loss of a lower insulating layer when the pad part is formed together with a pixel.

According to an exemplary embodiment of the present inventive concept, a display device may have a signal line of a pad part having a reduced susceptibility to defect and corrosion by reducing loss of the insulating layer around a pad when the pad part is formed together with a pixel.

While this inventive concept has been particularly shown and described with reference to exemplary embodiments thereof, it is to be understood by those of ordinary skill in the art that various changes in form and details may be made therein without departing from the scope of the inventive concept as defined by the following claims.

What is claimed is:
1. A display device comprising:
a substrate having a pixel region and a pad region;
a transistor disposed on the pixel region of the substrate;
wiring disposed on the pad region of the substrate,
  wherein the wiring is connected to the transistor and to
  a first pad;

an interlayer insulating layer disposed on the first pad, wherein the interlayer insulating layer has a contact hole exposing the first pad; and a second pad overlapping the first pad, wherein the second pad is connected to the first pad through the contact hole, wherein the interlayer insulating layer has a recess part having the same planar shape as the second pad, wherein the recess part is disposed along a boundary of the second pad, and wherein the recess part does not overlap the second pad.

2. The display device of claim 1, wherein the recess part has a width of 1 µm or less.

3. The display device of claim 2, further comprising a first electrode connected to the transistor, an organic light emitting layer disposed on the first electrode, and a second electrode disposed on the organic light emitting layer.

4. The display device of claim 1, wherein the transistor includes a semiconductor disposed on the substrate, a gate insulating layer is disposed on the semiconductor, a control electrode is disposed on the gate insulating layer, an input electrode is disposed on the control electrode, wherein the input electrode is connected to the semiconductor through a first contact hole, and an output electrode is disposed on the control electrode, wherein the output electrode is connected to the semiconductor through a second contact hole.

5. The display device of claim 4, wherein the first pad is disposed on the same layer as the control electrode, wherein the first pad includes a material that is the same as a material included in the control electrode.

6. The display device of claim 4, wherein the second pad is formed on the same layer as the input and output electrodes, the second pad including a material that is the same as a material included in the input and output electrodes.

7. A display device comprising:

a substrate having a pixel region and a pad region;

a transistor disposed on the pixel region of the substrate;

wiring disposed on the pad region of the substrate, wherein the wiring is connected to the transistor and to a first pad;

an interlayer insulating layer disposed on the first pad, wherein the interlayer insulating layer has a first contact hole exposing the first pad; and a second pad overlapping the first pad, wherein the second pad is connected to the first pad through the first contact hole, wherein a groove is formed around the second pad on a top portion of the interlayer insulating layer and extends along a border of the second pad, wherein the groove forms a closed loop, and wherein the groove does not overlap the second pad.

8. The display device of claim 7, wherein the groove has a width of 1 µm or less.

9. The display device of claim 7, further comprising a first electrode connected to the transistor, an organic light emitting layer disposed on the first electrode, and a second electrode disposed on the organic light emitting layer.

10. The display device of claim 7, wherein the transistor includes a semiconductor disposed on the substrate, a gate insulating layer is disposed on the semiconductor, a control electrode is disposed on the gate insulating layer, an input electrode is disposed on the control electrode, wherein the input electrode is connected to the semiconductor through a second contact hole, and wherein an output electrode is disposed on the control electrode, wherein the output electrode is connected to the semiconductor through a second contact hole.

11. The display device of claim 10, wherein the first pad is disposed on the same layer as the control electrode, wherein the first pad includes a material that is the same as a material included in the control electrode.

12. The display device of claim 10, wherein the second pad is formed on the same layer as the input and output electrodes, wherein the second pad includes a material that is the same as a material included in the input and output electrodes.

* * * * *